(12) United States Patent
Kim et al.

(10) Patent No.: US 8,964,462 B2
(45) Date of Patent: Feb. 24, 2015

(54) NONVOLATILE MEMORY DEVICE USING A THRESHOLD VOLTAGE SWITCHING MATERIAL AND METHOD FOR MANUFACTURING SAME

(75) Inventors: Taegeun Kim, Seongnam-si (KR); Homyoung An, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 13/876,136

(22) PCT Filed: Aug. 17, 2011

(86) PCT No.: PCT/KR2011/006034
§ 371 (c)(1),
(2), (4) Date: Mar. 26, 2013

(87) PCT Pub. No.: WO2012/138016
PCT Pub. Date: Oct. 11, 2012

(65) Prior Publication Data
US 2014/0036585 A1     Feb. 6, 2014

(30) Foreign Application Priority Data

Apr. 6, 2011  (KR) .................. 10-2011-0031846

(51) Int. Cl.
*G11C 13/00* (2006.01)
*G11C 11/34* (2006.01)
(Continued)

(52) U.S. Cl.
CPC ............ *G11C 11/34* (2013.01); *G11C 13/0002* (2013.01); *H01L 29/42332* (2013.01);
(Continued)

(58) Field of Classification Search
CPC ............... G11C 11/34; G11C 13/0002; G11C 13/0004; H01L 29/792; H01L 29/7881; H01L 29/42332; H01L 29/66825; H01L 29/66833

USPC .................. 365/184, 148, 158, 163
See application file for complete search history.

(56) References Cited

U.S. PATENT DOCUMENTS 8,179,711 B2 *  5/2012  Kim et al. ................. 365/148

FOREIGN PATENT DOCUMENTS

KR        10-0363749         2/2003
KR    10-2003-0092132       12/2003
(Continued)

OTHER PUBLICATIONS

International Search Report of International Application No. PCT/KR2011/006034, dated Mar. 21, 2012.

*Primary Examiner* — Tan T. Nguyen
(74) *Attorney, Agent, or Firm* — Kile Park Reed & Houtteman PLLC

(57) ABSTRACT

The present invention relates to a nonvolatile memory device and to a method for manufacturing same. According to the present invention, the blocking insulation layer of a nonvolatile memory device having a typical SONOS structure is replaced with a threshold voltage switching material, which changes to a low resistance state only while a voltage greater than a threshold voltage is applied while maintaining a high resistance state under normal conditions and returning to the high resistance state when the applied voltage is removed. The present invention performs a program operation by injecting charges from a gate electrode layer into a charge trap layer through an insulation layer formed of the threshold voltage switching material after applying a voltage pulse greater than the threshold voltage to the gate electrode layer.

12 Claims, 4 Drawing Sheets

(51) Int. Cl.
*H01L 29/423* (2006.01)
*H01L 29/66* (2006.01)
*H01L 29/788* (2006.01)
*H01L 29/792* (2006.01)

(52) U.S. Cl.
CPC .... *H01L29/66825* (2013.01); *H01L 29/66833* (2013.01); *H01L 29/7881* (2013.01); *H01L 29/792* (2013.01)
USPC ............ 365/184; 365/148; 365/158; 365/163

(56) References Cited

FOREIGN PATENT DOCUMENTS

| | | |
|---|---|---|
| KR | 10-2006-0089401 | 8/2006 |
| KR | 10-2008-0000357 | 1/2008 |
| KR | 10-2008-0038045 | 5/2008 |
| KR | 100871605 | 12/2008 |
| KR | 10-0890212 | 3/2009 |
| KR | 10-2010-0002713 | 1/2010 |
| WO | 95/33232 | 12/1995 |

* cited by examiner

NONVOLATILE MEMORY DEVICE USING A THRESHOLD VOLTAGE SWITCHING MATERIAL AND METHOD FOR MANUFACTURING SAME

TECHNICAL FIELD

The present invention relates to a memory device and a method for manufacturing the same, and more particularly, to a nonvolatile memory device and a method for manufacturing the same.

BACKGROUND ART

Recently, as demand for portable information devices such as smart phones drastically increases, required is developing a nano-sized nonvolatile memory (NVM) device capable of implementing ultra large scale integration (terabit), an ultra-miniaturized size, a high speed and high reliability.

However, as the nonvolatile memory device becomes small and integrated, a data retention capability is lowered due to leakage current, and power consumption efficiency is low due to a high operation voltage.

Accordingly, has been proposed a polySilicon-Oxide-Nitride-Oxide-Silicon (SONOS) type memory device having a memory characteristic of a high performance and compatible with the conventional processes, as the next generation nonvolatile memory device. However, such SONOS memory device also has the following disadvantages.

Firstly, in a case where a tunneling insulation layer formed of a silicon oxide film of a single layer has a reduced thickness for an enhanced operation speed, it cannot obtain a data retention characteristic more than 10 years, a characteristic of a nonvolatile memory, due to increase of direct tunneling and stress induced leakage current. If the thickness of the silicon oxide film is increased, a data retention characteristic more than 10 years can be obtained. However, in this case, an operation speed may be degraded, and a high voltage may be required.

Secondly, when performing an erasing operation using a blocking insulation layer formed of a silicon oxide film, electrons may be injected into a nitride film from a gate due to increase of an erasing voltage. This may cause the erasing operation not to be performed perfectly.

In the conventional non-volatile memory device having a SONOS structure, if a program voltage is increased for enhancement of a program speed, power consumption may increase, and defects inside the tunneling oxide film may increase. Further, if the thickness of the tunneling oxide film is reduced for an enhanced program speed while the program voltage is constantly maintained, leakage current may occur. This may cause reliability of the non-volatile memory device not to be obtained. Therefore, it was impossible to enhance the program speed with low power, while obtaining reliability on data retention.

DISCLOSURE OF THE INVENTION

Therefore, an object of the present invention is to provide a nonvolatile memory device capable of enhancing a program speed with low power, and capable of obtaining reliability on data retention, and a method for manufacturing the same.

To achieve these and other advantages and in accordance with the purpose of the present invention, as embodied and broadly described herein, there is provided a nonvolatile memory device, comprising: a substrate; a first insulation layer formed on the substrate; a charge trap layer formed on the first insulation layer; a second insulation layer formed on the charge trap layer, and having a state change between a low resistance state and a high resistance state according to an applied voltage pulse; and a gate electrode layer formed on the second insulating layer, and configured to apply a voltage pulse to the second insulation layer.

Preferably, the second insulation layer may be formed of a threshold voltage switching material which maintains a high resistance state when no voltage is applied thereto, but changes to a low resistance state only while a voltage greater than a threshold voltage is applied to the second insulation layer.

The threshold voltage switching material may be a chalcogenide-based material or $V_2O_5$.

In order to perform a program operation, the second insulation layer may maintain a low resistance state only while a voltage pulse greater than the threshold voltage for performing a program operation is applied and may pass charges introduced from a gate electrode layer to a charge trap layer there through.

The second insulation layer may prevent charges trapped in the charge trap layer, from being discharged to the gate electrode layer, in a high resistance state.

The charge trap layer may perform a program operation by trapping therein charges introduced from the second insulation layer.

A source region and a drain region may be formed at both sides of the first insulation layer on the substrate respectively.

In the nonvolatile memory device, if a negative voltage pulse having a magnitude greater than a threshold voltage of material forming the second insulation layer is applied to the gate electrode layer, charges from the gate electrode layer may be introduced to the charge trap layer through the second insulation layer having changed to a low resistance state, to thus be trapped in the charge trap layer. And, if the process of applying the voltage pulse is stopped, the second insulation layer may change to a high resistance state so that a program state can be maintained.

To achieve these and other advantages and in accordance with the purpose of the present invention, as embodied and broadly described herein, there is also provided a method for manufacturing a nonvolatile memory device, comprising: (a) forming a first insulation layer on a substrate; (b) forming a charge trap layer on the first insulation layer; (c) forming a second insulation layer on the charge trap layer, the second insulation layer having a state change between a low resistance state and a high resistance state according to an applied voltage pulse; and (d) forming, on the second insulation layer, a gate electrode layer which applies a voltage pulse to the second insulation layer.

In step (c), the second insulation layer may be formed of a threshold voltage switching material which maintains a high resistance state when no voltage is applied thereto, but change to a low resistance state only while a voltage greater than a threshold voltage of the material is applied.

The threshold voltage switching material may be a chalcogenide-based material or $V_2O_5$.

In order to perform a program operation, the second insulation layer may maintain a low resistance state only while a voltage pulse greater than the threshold voltage for performing a program operation is applied. And, the second insulation layer may pass charges introduced from a gate electrode layer to a charge trap layer there through.

The second insulation layer may prevent charges trapped in the charge trap layer, from being discharged to the gate electrode layer, in a high resistance state.

The method may further comprise forming a source region and a drain region at both sides of the first insulation layer on the substrate respectively.

The present invention may have the following advantages.

According to the present invention, the blocking insulation layer of a nonvolatile memory device having a typical SONOS structure is replaced with a threshold voltage switching material, which changes to a low resistance state only while a voltage greater than a threshold voltage is applied while maintaining a high resistance state under normal conditions and returning to the high resistance state when the applied voltage is removed. The present invention performs a program operation by injecting charges from a gate electrode layer into a charge trap layer through an insulation layer formed of the threshold voltage switching material after applying a voltage pulse greater than the threshold voltage to the gate electrode layer.

Accordingly, the nonvolatile memory device of the present invention does not use tunneling during programming and changes the resistance state of the threshold voltage switching material into a low resistance state in order to perform a program operation. Also, in order to maintain the charges trapped in the charge trap layer, no additional voltage pulse is required for converting the resistance state of the threshold voltage switching material into the high resistance state again. Therefore, fast programming is possible as compared to a nonvolatile memory device having a typical SONOS structure.

Moreover, since the nonvolatile memory device of the present invention does not use a tunneling method during programming, data retention for a minimum of 10 years may be obtained by forming the insulation layer to a sufficient thickness between the charge trap layer and the substrate. Thus, compared to a nonvolatile memory device having a typical SONOS structure, reliability may be further improved.

MODES FOR CARRYING OUT THE PREFERRED EMBODIMENTS

Hereinafter, preferred embodiments of the present invention will be explained with reference to the attached drawings.

Figure 1:
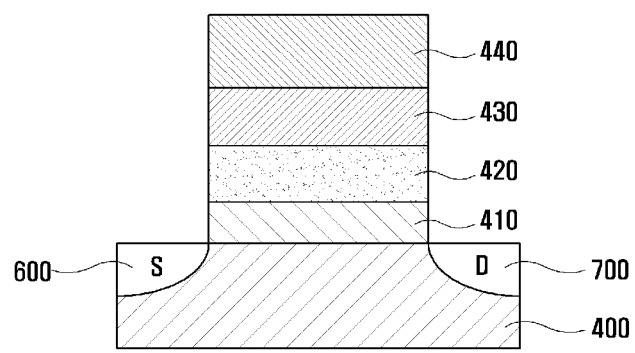
FIG. 1 is a view showing a structure of a nonvolatile memory device according to a preferred embodiment of the present invention.

FIG. 1 is a view showing a structure of a nonvolatile memory device according to a preferred embodiment of the present invention.

Referring to FIG. 1, the nonvolatile memory device according to the present invention has a structure where a memory layer is formed on a semiconductor substrate 400, and a source region 600 and a drain region 700 are formed on the semiconductor substrate 400 at both sides of the memory layer.

The memory layer formed on the semiconductor layer 400 includes a first insulation layer 410 formed on the semiconductor layer 400, a charge trap layer 420 formed on the first insulation layer 410, a second insulation layer 430 formed on the charge trap layer 420, and a gate electrode layer 440 formed on the second insulation layer 430.

The first insulation layer 410 prevents charges trapped in the charge trap layer 420, from being discharged to the substrate 400. The first insulation layer 410, an oxide film formed in thickness of several nanometers (nm) through a thermal oxidation process or a well-known thin film deposition process, may be formed of a silicon oxide film ($SiO_2$), etc. In a preferred embodiment of the present invention, the first insulation layer 410 was formed in thickness of 10~100 nm, in order to prevent charges trapped in the charge trap layer 420 from being discharged to the substrate 400.

The charge trap layer 420 performs an program operation by trapping therein charges introduced from the gate electrode layer 440, through the second insulation layer 430. The charge trap layer 420 may be formed of a nano-crystalline material or a silicon nitride film. The charge trap layer 420 may be also formed of one of a material having a higher dielectric constant (high-k) than $SiO_2$, and an amorphous poly silicon material.

Alternatively, the charge trap layer 420 may be formed of metal such as tungsten, molybdenum, cobalt, nickel, platinum, rhodium, palladium and iridium, or a mixture thereof, or an alloy thereof. Alternatively, the charge trap layer 420 may be formed of a semiconductor material such as silicon, germanium, a mixture of silicon and germanium, a III-V compound (a combination of Al, Ga and In of a group III, and P, As and Sb of a group V) or II-VI compound (a combination of Zn, Cd and Hg of a group II, and O, S, Se and Te of a group VI). Alternatively, the charge trap layer 420 may be formed of an insulator having a high density for trapping charges, such as aluminum oxide (Al2O3), hafnium oxide (HfO), hafnium aluminum oxide (HfAlO), and hafnium silicon oxide (HfSiO).

The second insulation layer 430 is formed of a threshold voltage switching material. The threshold voltage switching material indicates a material which changes to a low resistance state only while a voltage greater than a threshold voltage is applied thereto while maintaining a high resistance state under normal conditions, and which returns to the high resistance state when the voltage applied thereto is removed.

The second insulation layer 430 prevents charges from moving between the gate electrode layer 440 and the charge trap layer 420, in a high resistance state where no voltage has been applied. However, the second insulation layer 430 allows charges from moving between the gate electrode layer 440 and the charge trap layer 420, in a low resistance state where a voltage greater than a threshold voltage has been applied.

Generally, the gate electrode layer 440 is formed of a material which can be utilized as an electrode of a semiconductor device.

Figure 2:
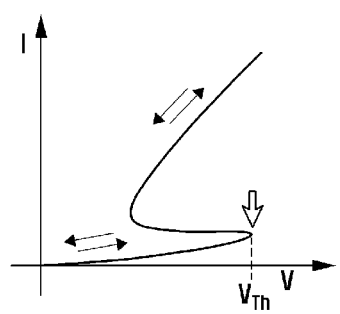
FIG. 2 is a graph showing a relation between voltage and current, with respect to a threshold voltage switching material of a second insulation layer according to the present invention.

FIG. 2 is a graph showing a relation between voltage and current, with respect to a threshold voltage switching material of the second insulation layer 430 according to the present invention. The threshold voltage switching material of the present invention will be explained in more detail with reference to FIG. 2.

The threshold voltage switching material of the insulation layer 430, such as a chalcogenide-based material (e.g., AlAsTe, SiGeAsTe and GeSeTe), or $V_2O_5$, indicates a material which changes to a low resistance state only while a voltage greater than a threshold voltage is applied thereto while maintaining a high resistance state under normal conditions, and which returns to the high resistance state when the applied voltage is removed.

As shown in FIG. 2, the threshold voltage switching material is in a low resistance state where a high current flows, when a voltage greater than a threshold voltage (Vth) is applied thereto. However, the threshold voltage switching material returns to the high resistance state when the applied voltage is removed, as the current drastically decreased along the curve 'V-I'.

Figure 3A:
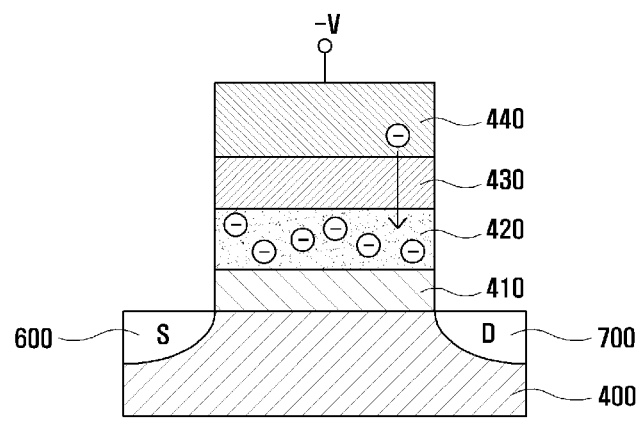
FIGS. 3A and 3B are views showing a method for performing a program operation and a method for removing a program state in a nonvolatile memory device according to the present invention, respectively.
Figure 3A:
Figure 3A:
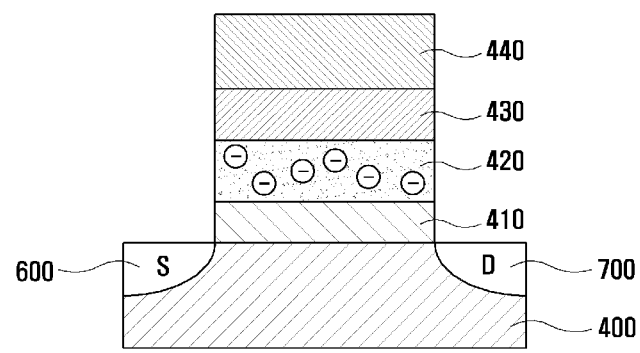
Figure 3B:
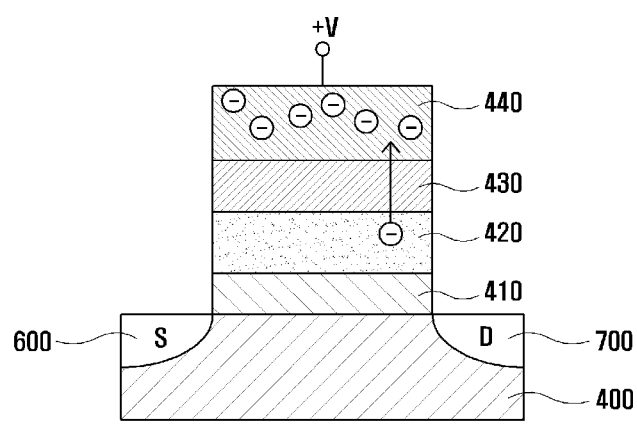

FIGS. 3A and 3B are views showing a method for performing a program operation and a method for removing a program state in the nonvolatile memory device according to the present invention, respectively.

In a preferred embodiment of the present invention, a program operation is performed as follows. Referring to FIG. 3A, in a state where the source region 600 and the drain region 700 are grounded, a voltage pulse (−V) greater than a threshold voltage of a second insulation layer 430 is applied to a gate electrode layer 440. As a result, the second insulation layer 430 of a high resistance state is converted into a low resistance state. Then, charges are injected into the charge trap layer 420 from the gate electrode layer 440, to thus be trapped in the charge trap layer 420. Then, the process of applying the voltage pulse is stopped to convert the second insulation layer 430 into the high resistance state again. As a result, the charges trapped in the charge trap layer 420 are prevented from being discharged to the gate electrode layer 440 through the second insulation layer 430.

Referring to FIG. 3B, in order to erase the program state of FIG. 3A, a voltage pulse (+V) is applied to the gate electrode layer 440, the voltage pulse (+V) having a polarity opposite to that applied while performing a program operation, and having a magnitude greater than a threshold voltage. As a result, the second insulation layer 430 is converted into a low resistance state. Then, the charges trapped in the charge trap layer 420 are discharged to the gate electrode layer 440 through the second insulation layer 430. Then, the second insulation layer 430 is converted into a high resistance state as the voltage pulse applied to the gate electrode layer is removed.

Figure 4A:
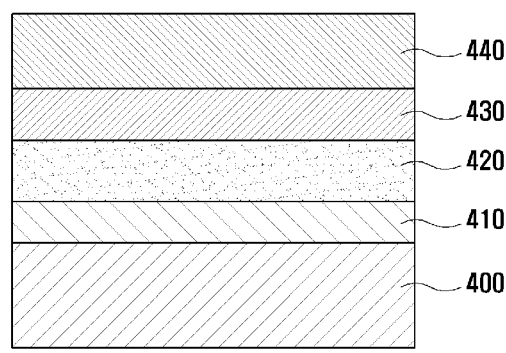
FIGS. 4A to 4C are views showing a method for manufacturing a nonvolatile memory device according to a preferred embodiment of the present invention.
Figure 4B:
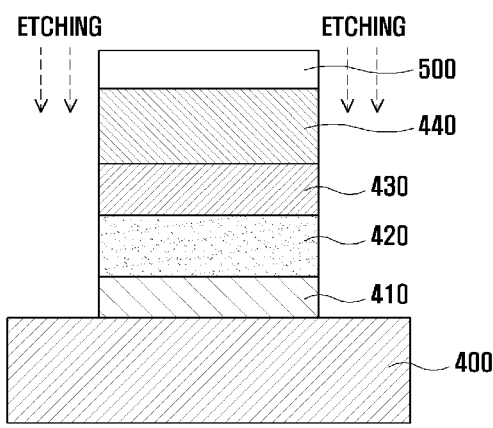
Figure 4C:
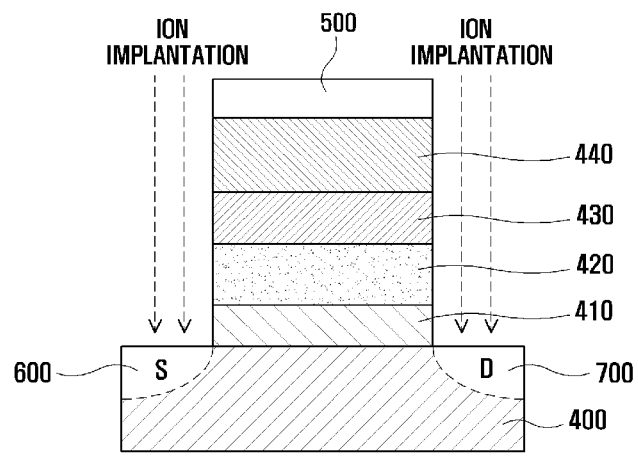

FIGS. 4A to 4C are views showing a method for manufacturing a nonvolatile memory device according to a preferred embodiment of the present invention.

A method for manufacturing a nonvolatile memory device according to the present invention will be explained with reference to FIGS. 4A to 4C.

Referring to FIG. 4A, on the semiconductor substrate 400, sequentially formed are the first insulation layer 410, the charge trap layer 420, the second insulation layer 430 and the gate electrode layer 440.

The first insulation layer 410 such as a silicon oxide film ($SiO_2$) is formed in thickness of 10~100 nm, through a thermal oxidation process or a well-known thin film deposition process.

The charge trap layer 420 is formed in thickness of 50 nm~1000 nm. As aforementioned, the charge trap layer 420 may be formed of a nano-crystalline material or a silicon nitride film, etc. The charge trap layer 420 may be also formed of one of a material having a higher dielectric constant (high-k) than $SiO_2$, and an insulator such as an amorphous poly silicon material, the insulator having a high density for trapping charges.

The second insulation layer 430 is formed of a threshold voltage switching material such as a chalcogenide-based material (e.g., AlAsTe, SiGeAsTe and GeSeTe) or $V_2O_5$, in thickness of 10~100 nm. The threshold voltage switching material was aforementioned, and thus detailed explanations thereof will be omitted.

After the gate electrode layer 440 has been formed, as shown in FIG. 4B, a hard mask film pattern 500 is formed on a region where a memory layer is to be formed. Then, the gate electrode layer 440, the second insulation layer 430, the charge trap layer 420 and the first insulation layer 410 are etched, using the hard mask film pattern as an etching mask, until the semiconductor substrate 400 is exposed.

In the present invention, a spacing distance between the source region 600 and the drain region 700 is within the range of several tens of nanometers (nm) several hundreds of nanometers (nm). Accordingly, the width of the memory layer disposed between the source region 600 and the drain region 700 is also within the range of several tens of nm~several hundreds of nm. Therefore, the length of the hard mask film pattern 500 is determined according to the width of the memory layer.

Then, as shown in FIG. 4C, the source region 600 and the drain region 700 are formed on the semiconductor substrate 400 on two side surfaces of the memory layer, through an ion implantation process. Then, the hard mask film pattern 500 is removed to complete a nonvolatile memory device.

In the method for manufacturing a nonvolatile memory device, the thicknesses of the components, etc. may be variable according to production conditions.

It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

The invention claimed is:

1. A nonvolatile memory device, comprising:
a substrate;
a first insulation layer formed on the substrate;
a charge trap layer formed on the first insulation layer;
a second insulation layer formed on the charge trap layer, and having a state change between a low resistance state and a high resistance state according to an applied voltage pulse; and
a gate electrode layer formed on the second insulating layer, and configured to apply a voltage pulse to the second insulation layer, wherein the second insulation layer is formed of a threshold voltage switching material which maintains a high resistance state when no voltage is applied thereto, but changes to a low resistance state only while a voltage greater than a threshold voltage is applied to the second insulation layer.

2. The nonvolatile memory device of claim 1, wherein the threshold voltage switching material is a chalcogenide-based material or $V_2O_5$.

3. The nonvolatile memory device of claim 1, wherein in order to perform a program operation, the second insulation layer maintains a low resistance state only while a voltage pulse greater than the threshold voltage for performing a program operation is applied to the gate electrode layer, and passes charges introduced from a gate electrode layer to a charge trap layer there through.

4. The nonvolatile memory device of claim 1, wherein the second insulation layer prevents charges trapped in the charge trap layer, from being discharged to the gate electrode layer, in a high resistance state.

5. The nonvolatile memory device of claim 1, wherein the charge trap layer performs a program operation by trapping therein charges introduced from the second insulation layer.

6. The nonvolatile memory device of claim 1, wherein a source region and a drain region are formed at both sides of the first insulation layer on the substrate respectively.

7. The nonvolatile memory device of claim 6, wherein if a negative voltage pulse having a magnitude greater than a threshold voltage of a material forming the second insulation layer is applied to the gate electrode layer, charges from the gate electrode layer are introduced to the charge trap layer through the second insulation layer having changed to a low resistance state, to thus be trapped in the charge trap layer, and
    wherein if the process of applying the voltage pulse is stopped, the second insulation layer changes to a high resistance state such that a program state is maintained.

8. A method for manufacturing a nonvolatile memory device, comprising:
    (a) forming a first insulation layer on a substrate;
    (b) forming a charge trap layer on the first insulation layer;
    (c) forming a second insulation layer on the charge trap layer, the second insulation layer having a state change between a low resistance state and a high resistance state according to an applied voltage pulse; and
    (d) forming, on the second insulation layer, a gate electrode layer which applies a voltage pulse to the second insulation layer, wherein in step (c), the second insulation layer is formed of a threshold voltage switching material which maintains a high resistance state when no voltage is applied thereto, but change to a low resistance state only while a voltage greater than a threshold voltage of the material is applied.

9. The method of claim 8, wherein the threshold voltage switching material is a chalcogenide-based material or $V_2O_5$.

10. The method of claim 8, wherein in order to perform a program operation, the second insulation layer maintains a low resistance state only while a voltage pulse greater than the threshold voltage for performing a program operation is applied, and passes charges introduced from a gate electrode layer to a charge trap layer there through.

11. The method of claim 8, wherein the second insulation layer prevents charges trapped in the charge trap layer, from being discharged to the gate electrode layer, in a high resistance state.

12. The method of claim 8, further comprising forming a source region and a drain region at both sides of the first insulation layer on the substrate respectively.

* * * * *